US009103513B2

(12) United States Patent  
Fan

(10) Patent No.: US 9,103,513 B2  
(45) Date of Patent: Aug. 11, 2015

(54) FLEXIBLE CIRCUIT BOARD AND METHOD FOR MANUFACTURING THE SAME, AND LED FLEXIBLE STRIP LIGHT

(71) Applicant: HE SHAN LIDE ELECTRONIC ENTERPRISE COMPANY LTD., Heshan City (CN)

(72) Inventor: Ben Fan, Heshan (CN)

(73) Assignee: Heshan Tongfang Lighting Technology Company Limited, Heshan (CN)

( * ) Notice: Subject to any disclaimer, the term of this patent is extended or adjusted under 35 U.S.C. 154(b) by 0 days.

(21) Appl. No.: 14/506,000

(22) Filed: Oct. 3, 2014

(65) Prior Publication Data

US 2015/0117001 A1    Apr. 30, 2015

(30) Foreign Application Priority Data

Oct. 24, 2013   (CN) ..................... 2013 2 0660256 U  
Nov. 14, 2013   (CN) ..................... 2013 1 0564102  
Nov. 19, 2013   (CN) ..................... 2013 2 0736188 U  
Nov. 29, 2013   (CN) ..................... 2013 1 0627837  
Dec. 27, 2013   (CN) ..................... 2013 2 0883675 U  
Apr. 28, 2014   (CN) ..................... 2014 1 0174783

(51) Int. Cl.
```
F21V 21/00     (2006.01)
F21S 4/00      (2006.01)
F21V 21/14     (2006.01)
F21K 99/00     (2010.01)
F21V 7/00      (2006.01)
F21V 23/00     (2015.01)
H05K 3/10      (2006.01)
F21Y 101/02    (2006.01)
```

(52) U.S. Cl.  
CPC . *F21S 4/005* (2013.01); *F21K 9/30* (2013.01); *F21K 9/50* (2013.01); *F21K 9/90* (2013.01); *F21V 7/0066* (2013.01); *F21V 21/14* (2013.01); *F21V 23/001* (2013.01); *H05K 3/10* (2013.01); *F21Y 2101/02* (2013.01)

(58) Field of Classification Search  
CPC . H01R 12/68; H05K 1/028; H05K 2201/042; H05K 2201/055  
USPC .................. 362/219, 221, 225, 236, 240, 290  
See application file for complete search history.

(56) References Cited

U.S. PATENT DOCUMENTS

| | | | | |
|---|---|---|---|---|
| 4,514,791 | A * | 4/1985 | Tokieda | 362/249.01 |
| 2003/0168247 | A1* | 9/2003 | Schreck et al. | 174/126.4 |
| 2004/0037079 | A1* | 2/2004 | Luk | 362/252 |
| 2005/0092517 | A1* | 5/2005 | Fan | 174/117 FF |
| 2005/0117356 | A1* | 6/2005 | Lin | 362/456 |
| 2007/0263385 | A1* | 11/2007 | Fan | 362/252 |
| 2010/0163916 | A1* | 7/2010 | Chiang | 257/99 |

* cited by examiner

*Primary Examiner* — Andrew Coughlin  
(74) *Attorney, Agent, or Firm* — Hamre, Schumann, Mueller & Larson, P.C.

(57) ABSTRACT

A flexible circuit board is disclosed, including a first insulation layer, a second insulation layer and a circuit layer, wherein the first insulation layer is attached to one side of the circuit layer and the second insulation layer is attached to the other side of the circuit layer, each of the first insulation layer and the second insulation layer is provided with a foldable portion along their length, the foldable portion of the first insulation layer is corresponding in position with the foldable portion of the second insulation layer, and the circuit layer includes a set of power wires and at least one lighting wire. And a method for manufacturing the flexible circuit board, and a LED flexible strip light are also disclosed.

22 Claims, 14 Drawing Sheets

FLEXIBLE CIRCUIT BOARD AND METHOD FOR MANUFACTURING THE SAME, AND LED FLEXIBLE STRIP LIGHT

TECHNICAL FIELD

The present disclosure relates generally to a technical field of lighting devices, and more particularly, to a flexible circuit board and method for manufacturing the same, and a LED flexible strip light.

BACKGROUND

Due to having the capacity of bending, flexible circuit boards can be applied to some fields where the circuit board will be bent. By using of a flexible circuit board, a LED flexible strip light can generate a line source with a elongated shape when electrified, so the flexible circuit boards can be widely applied to decoration and illumination in various situations, such as building, signboard, showcase and so on.

In traditional flexible circuit boards, a plurality of LEDs are welded on a soft circuit board with a elongated plate shape to form a LED strip source, and the periphery of the LED strip source is covered with an insulation layer, such that a line source with a elongated shape can be generated when electrified. The soft circuit board includes a conductive copper foil and an insulating film, and generally has a single-layer or multilayer structure, where the conductive copper foil and insulating film of each layer are independent of each other and stacked together, and the conductive copper foil can be divided into connection line and power wire. The LED flexible strip light has a high requirement on its width that the smaller the width is, the more flexible the LED flexible strip light is and the simpler the installation or the modeling is. However, in traditional soft circuit boards, the connection line and the power wire are generally positioned on a same plane, in this way, the width is large. In other cases, the connection line and the power wire may be positioned on different planes to reduce the width, but this structure has numerous deficiencies in production, such as too many planes to be stacked, complex process with more steps, much trouble to align the planes, low yield and so on.

SUMMARY

In view of the above, an object of the present disclosure is to provide a flexible circuit board which is manufactured by simple process, not easy to be wrinkling, and has relatively narrow width.

It is a further object of the present disclosure to provide a LED flexible strip light which is manufactured by simple process, not easy to be wrinkling, and has relatively narrow width.

According to one aspect of the present disclosure, a flexible circuit board includes: a first insulation layer, a second insulation layer and a circuit layer, wherein the first insulation layer is attached to one side of the circuit layer and the second insulation layer is attached to the other side of the circuit layer, each of the first insulation layer and the second insulation layer is provided with a foldable portion along their length, the foldable portion of the first insulation layer is corresponding in position with the foldable portion of the second insulation layer, and the circuit layer includes a set of power wires and at least one lighting wire.

The power wire and the lighting wire are located on each side of the foldable portion respectively. The width of the flexible circuit board becomes smaller after being folded, in order to meet more fields where a flexible circuit board with smaller width is required. The power wire and the lighting wire will not be bent as the flexible circuit board being folded when areas on both sides of the foldable portion are folded towards each other. The foldable portion can prevent the power wire folded plane layer and the lighting wire folded plane layer from warping, such that the power wire folded plane layer and the lighting wire folded plane layer are easy to be close to each other, that is, the folded plane layers are not easy to be separated from each other using the foldable portion as axis due to the elastic restoring force on the position of the foldable portion of the insulation layer, which is a further improvement scheme of the folding solution. The foldable portion can also reduce the drag force between the planes to increase the bending ability of the circuit board, and reduce wrinkling.

Preferably, the power wire and the lighting wire are formed by etching technology or metal wire calendering. The power wire and the lighting wire formed by metal wire calendering can be calendered to have different widths and thicknesses upon their current and voltage and heat dissipation.

Preferably, the flexible circuit board is formed with a plurality of folded plane layers including a power wire folded plane layer and a lighting wire folded plane layer. The power wire folded plane layer includes a first insulation layer, a power wire and a second insulation layer, while the lighting wire folded plane layer includes a first insulation layer, a lighting wire and a second insulation layer. The foldable portion is located between the power wire folded plane layer and the lighting wire folded plane layer. The power wire folded plane layer and the lighting wire folded plane layer are folded with respect to the foldable portion. The power wire and the lighting wire are provided on their corresponding power wire folded plane layer and lighting wire folded plane layer respectively, so when the flexible circuit board is folded, only the insulation layers are folded, while the power wire and the lighting wire are not bent, and the width of the insulation layer will be much smaller after being folded, reducing the width of the flexible circuit board.

Preferably, the flexible circuit board includes at least one lighting wire folded plane layer which includes at least one lighting wire. A foldable portion is provided between the adjacent lighting wire folded plane layers, and the adjacent lighting wire folded plane layers are folded with respect to the foldable portion. When there is one lighting wire folded plane layer, the width of the flexible circuit board is small, bringing more convenient to use, and when there are two lighting wire folded plane layers, both sides of the flexible circuit board are equipped with a LED light source, bringing a larger light-emitting angle.

Preferably, the foldable portion can be a folding line. The first insulation layer and the second insulation layer can be folded by the folding line which brings a good folding effect and reduces wrinkling.

Preferably, the foldable portion can be a die cut. The die cut not only saves material but also reduces the drag force between the planes to increase the bending ability of the circuit board, and reduces wrinkling.

Preferably, there are two power wires. The two power wires are parallelly arranged on the same power wire folded plane layer, two lighting wires are parallelly arranged on one side of the power wires. The first insulation layer and the second insulation layer are provided with a first die cut between the power wires and the lighting wires, and the first insulation layer and the second insulation layer are provided with a second die cut between the two lighting wires. The first die cut of the first insulation layer is corresponding in position with the first die cut of the second insulation layer, and the second die cut of the first insulation layer is corresponding in position with the second die cut of the second insulation layer. Each of the first insulation layer and the second first insulation layer is folded along their own first die cut and second die cut to form three folded plane layers, the power wire folded plane layer where the power wire is placed in is in the middle of the three folded plane layers, and the lighting wire folded plane layers where the two lighting wires are placed in respectively are located in the top and the bottom of the three folded plane layers respectively, and the three folded plane layers form a flat-shaped coil. In this structure, both of the top side and the bottom side of the flexible circuit board can give out light, and the lighting wires are convenient to be welded at one time, because the LED sources are located on the same plane before the flexible circuit board being folded.

Preferably, the number of the power wires can be two. The two power wires are parallelly arranged on the same power wire folded plane layer, one lighting wire is arranged on one side of the power wires. The first insulation layer and the second insulation layer are provided with a first die cut between the power wires and the lighting wire, the first die cut of the first insulation layer is corresponding in position with the first die cut of the second insulation layer, each of the first insulation layer and the second first insulation layer is folded along their own first die cut to form two folded plane layers, and the lighting wire folded plane layer where the lighting wire is placed in is located above the power wire folded plane layer where the power wire is placed in.

Preferably, the power wire includes a first power wire and a second first power wire both of which are located on both sides of the circuit board respectively, the lighting wire is located between the first power wire and the second power wire, and the number of the lighting wire is one or two. In this structure, the power wires are arranged on both sides of the flexible circuit board, which forms a two-layered structure after the flexible circuit board being folded, where each layer has a power wire and a lighting wire. In this way, both of the top side and the bottom side of the LED flexible light source can give out light, and there are only two folded plane layers.

Preferably, the number of the lighting wire can be two. The two lighting wires are parallelly arranged, each of the first insulation layer and the second insulation layer is provided with a third die cut between the lighting wires, each of the first insulation layer and the second first insulation layer is folded along their own third die cut to form two folded plane layers, and each of the folded plane layers includes a power wire and a lighting wire. In this structure, the power wires are arranged on both sides of the flexible circuit board, the flexible circuit board can form two folded plane layers after being folded, and each of the folded plane layers includes a power wire and a lighting wire. In this way, both of the top side and the bottom side of the LED flexible light source can give out light, and there are only two folded plane layers.

Preferably, areas in the first insulation layer and the second insulation layer corresponding to the lighting wire are equal in length to the lighting wire, areas in the first insulation layer and the second insulation layer corresponding to the power wire are equal in length to the power wire, the power wire is longer than the lighting wire, and gaps are formed between the area in the first insulation layer corresponding to the lighting wire and the area in the first insulation layer corresponding to the power wire, and between the area in the second insulation layer corresponding to the lighting wire and the area in the second insulation layer corresponding to the power wire. In this structure, the creepage distance between an end of the lighting wire and an end of the power wire can be increased, which helps to realize and meet the requirement of the creepage distance required by safety standards.

Preferably, the thickness of the lighting wire is lower than that of the power wire. In this way, such configuration will save the material as well as increase the flexibility of the lighting wire to avoid LED welding spot cracking in a situation that the circuit board is excessively bent, and it will result in more reliable quality.

According to another aspect of the present disclosure, a LED flexible strip light includes an insulation cladding layer, a plurality of LED light sources and a flexible circuit board as above, wherein a plurality of fractures are provided on a same lighting wire, the LED light source is welded on the fracture or across two adjacent lighting wires, positions in the first insulation layer and/or second insulation layer corresponding to the LED light sources are provided with LED windows, the flexible circuit board is cladded by an insulation cladding layer, and the insulation cladding layer is circular, flat, rectangular, arched, triangular or D-shaped in cross section.

The first insulation layer and the second insulation layer in the LED flexible strip light with this flexible circuit board will not be wrinkled when the flexible circuit board is folded, to achieve better performance. Meanwhile, the flexible circuit board is placed in the insulation cladding layer by folding that the width of the LED flexible strip light can be decreased and it conforms to the LED flexible strip light development tendency.

Preferably, the insulation cladding layer is a flat shape in cross section, two sides of the insulation cladding layer are reflective bodies completely or partially, the top of the insulation cladding layer is an insulated light transmitting body, the bottom of the insulation cladding layer is an insulated light transmitting body or reflective body, the LED light source is welded on the flexible circuit board, and the flexible circuit board is vertically positioned that the side of the flexible circuit board on which the LED light source is welded faces towards the lateral side of the insulation cladding layer.

Preferably, a plurality of light transmitting components protruding from the outside surface of the insulation cladding layer are provided on each position corresponding to each of the LED light sources on the outside surface of the insulation cladding layer, and each light transmitting component is independent and arranged separating from any other. One the one hand, the protruded light transmitting component can be used for light transmitting, and on the other hand, the protruded light transmitting component is in a shape similar to a light transmitting component of the traditional LED light string, which fits the consumptive psychology better.

Preferably, the light transmitting component can be positioned on the insulation cladding layer by threaded connecting, bonding, riveting, binding or fastening. The light transmitting component can be positioned on the insulation cladding layer in any way as required.

Preferably, the light transmitting component includes a connector and a cover. The cover includes a light transmitting portion placed towards a LED light-emitting surface, and a clamping portion for clamping the insulation cladding layer, and the light transmitting portion and the clamping portion are made of a whole. The connector is fixed with the cover, and fastens the insulation cladding layer in the clamping portion. Preferably, the connector is circular, and the outside surface of the clamping portion is a circular surface making it convenient to fasten the connector on the cover, without directional limitation, and making it possible to achieved mechanization and automation in fastening.

Preferably, the light transmitting component and the insulation cladding layer are made of a whole, that is, the light transmitting component is integral with the insulation cladding layer.

Preferably, a light blocking layer is provided around the outside surface of the insulation cladding layer. A plurality of separate light outlet windows are provided on each position corresponding to the light-emitting surface of each of the LED light sources on the light blocking layer. The light blocking layer can be ink or paint to achieve a better illumination of a point light source, while the light emitted from a traditional LED flexible strip light without a light blocking layer is appeared as a linear light source.

Preferably, the LED flexible strip light further includes a connection head used to connect two LED flexible strip lights or connect the LED flexible strip light with a power cord. The connection head includes a fixed part, and two hard metal conductor strips which are spaced apart from each other and are arranged in parallel. Each of the hard metal conductor strips includes two ends as two connection ends of the connection head, and the surface of the hard metal conductor strip is provided with at least one puncture portion used to puncture the first insulation layer and/or the second insulation layer of the flexible circuit board and electrically contact with the power wire of the flexible circuit board. A part of the hard metal conductor strip is enveloped in the fixed part.

Preferably, the LED flexible strip light further includes a connection head used to connect two LED flexible strip lights or connect the LED flexible strip light with a power cord. The connection head includes a fixed part, and two hard metal conductor strips which are spaced apart from each other and are arranged in parallel. Each of the hard metal conductor strips includes two ends as two connection ends of the connection head. The hard metal conductor strip is electrically connected with power wire of the flexible circuit board or the power cord. A part of the hard metal conductor strip is enveloped in the fixed part. The fixed part expands towards two ends or one of the ends of the hard metal conductor strip to form a tongue plate which can be inserted into and fastened to the gap between the insulation cladding layer and the flexible circuit board.

Preferably, the LED light source can be a SMD (Surface Mount Device) LED or a bonding LED chip, and the LED light source can have at least one LED chip.

Preferably, the insulation cladding layer can include an inner insulation cladding layer and an outer insulation cladding layer, the inner insulation cladding layer is made of a translucent material or an opaque material which is selected from the group consisting of PU glue, TPU glue, silicone and PVC glue, and the outer insulation cladding layer is made of a translucent material.

Preferably, the insulation cladding layer is rectangular, circular or arched in cross section. The insulation cladding layer fitting the shape of a LED tape light, a duralight or a flexible neon lamp can be used as required.

Preferably, the space between the light transmitting components can be larger than 4.5 centimeters. When the space between the light transmitting components is larger than 4.5 centimeters, the effect of the point light source should be more obvious.

Preferably, two ends of the LED flexible strip light are provided with a male connector and a female connector respectively. The male connector and the female connector can be engaged with each other and also can be disengaged from each other, which is easier for operation.

Preferably, the power port can include a power plug, a current or voltage conversion device and a wire, and the current or voltage conversion device is a rectifier bridge, constant current power supply or switching power supply.

According to a further aspect of the present disclosure, a method for manufacturing the flexible circuit board as above includes: arranging a plurality of flat wires formed by metal wire calendaring parallelly, where the flat wires includes two power wires adjacently placed, and at least one lighting wire provided with a fracture needed; attaching a first insulation layer and a second insulation layer to the upper and lower surfaces of the power wire and the lighting wire respectively; and folding the first insulation layer and the second insulation layer to form a power wire folded plane layer and a lighting wire folded plane layer, where the power wire folded plane layer only includes a power wire.

Preferably, the first insulation layer and the second insulation layer are provided with a plurality of die cuts along a folded position.

The flexible circuit board manufactured in the above method has the advantages of a narrow width, easy manufacture and good heat dissipation effect.

It should be noted that, the terms such as "first" and "second" mentioned here do not represent a specific number or order, but are used to distinguish between names of components. Any product of the present disclosure does not need to achieve all of the above effects at the same time.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DETAILED DESCRIPTION OF THE PREFERRED EMBODIMENTS

In the following description of embodiments, reference is made to the accompanying drawings which form a part hereof, and in which it is shown by way of illustration specific embodiments of the disclosure that can be practiced. It is to be understood that other embodiments can be used and structural changes can be made without departing from the scope of the disclosed embodiments.

Figure 6:
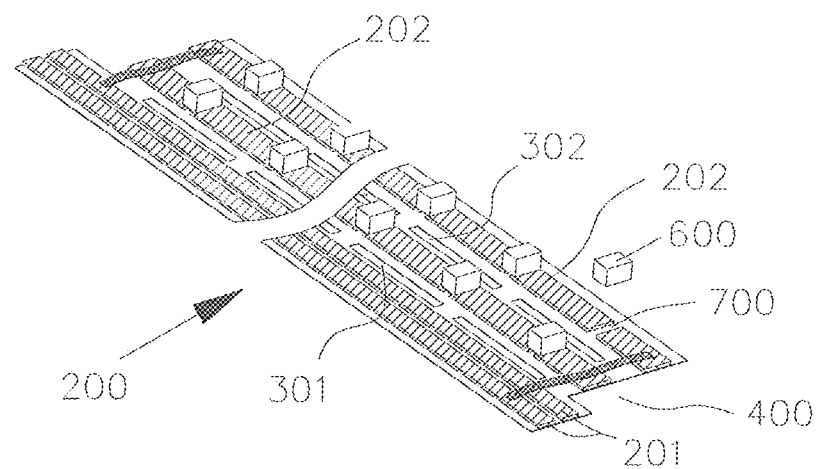
FIG. 6 is a schematic diagram of a circuit layer of the flexible circuit board of FIG. 1.

In accordance with certain embodiments, described with reference to FIGS. 1-15, a flexible circuit board includes: a first insulation layer 101, a second insulation layer 102 and a circuit layer 200. The first insulation layer 101 and the second insulation layer 102 may be fitted on each side of the circuit layer 200 respectively by hot pressing process. Each of the first insulation layer 101 and the second insulation layer 102 is provided with a foldable portion 301, 302 along their length, the foldable portion of the first insulation layer 101 is corresponding in position with the foldable portion of the second insulation layer 102, as shown in FIG. 6, and the circuit layer 200 includes a set of power wires 201 and two lighting wires 202. The power wire 201 and the lighting wire 202 are located on each side of the foldable portion respectively, and the thickness of the lighting wire 202 is lower than that of the power wire 201. In this way, such configuration will save the material as well as increase the flexibility of the lighting wire 202 to avoid LED welding spot cracking in a situation that the circuit board is excessively bent, and it will result in more reliable quality. The power wire 201 and the lighting wire 202 are formed by etching technology or metal wire calendering. The power wire and the lighting wire formed by metal wire calendering can be calendered to have different widths and thicknesses upon their current and voltage and heat dissipation.

The power wire 201 and the lighting wire 202 are located on each side of the foldable portion respectively. The width of the flexible circuit board becomes smaller after being folded, in order to meet more fields where a flexible circuit board with smaller width is required. The power wire 201 and the lighting wire 202 will not be bent when the flexible circuit board is folded, as only the insulation layers are folded that areas on both sides of the foldable portion are folded towards each other. Because of the foldable portions, it can prevent the power wire folded plane layer 103 and the lighting wire folded plane layer 104 from warping, such that the power wire folded plane layer 103 and the lighting wire folded plane layer 104 are easy to be close to each other, that is, the folded plane layers are not easy to be separated from each other using the foldable portion as axis due to the elastic restoring force on the position of the foldable portion of the insulation layer, which is a further improvement scheme of the folding solution. The foldable portion can also reduce the drag force between the plane layers to increase the bending ability of the circuit board, and reduce wrinkling.

Figure 7:
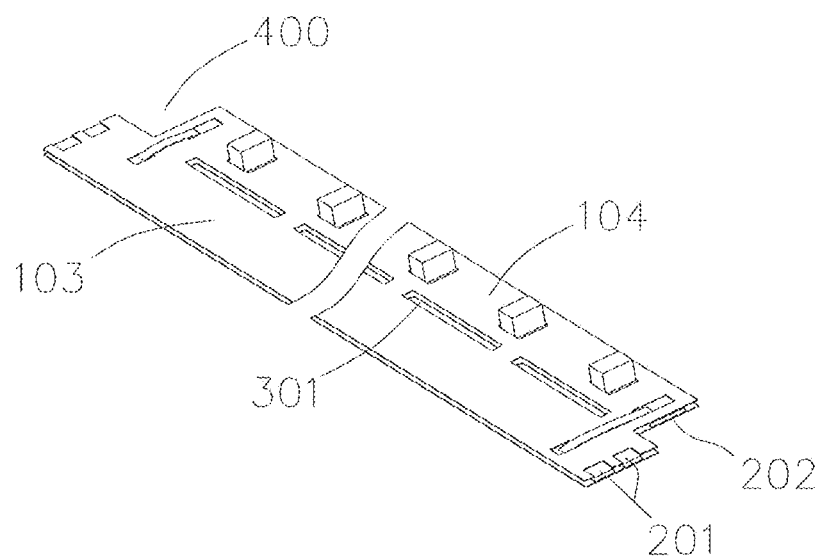
FIG. 7 is an assembly diagram of a flexible circuit board in accordance with one embodiment of the present disclosure.
Figure 8:
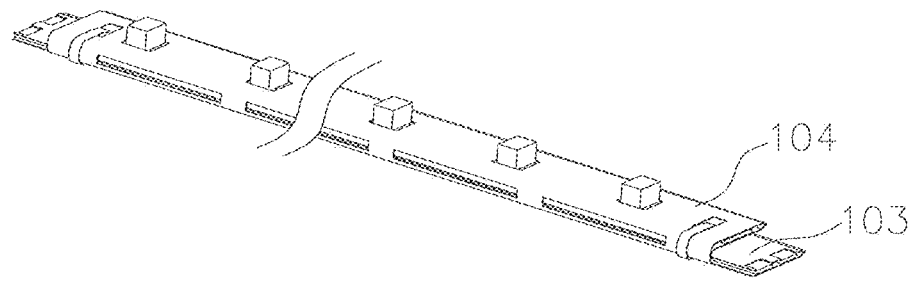
FIG. 8 is a schematic diagram showing the flexible circuit board of FIG. 7 which has been folded.
Figure 9:
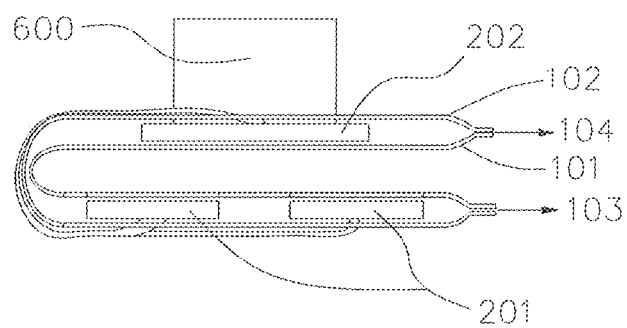
FIG. 9 is a side view of the flexible circuit board of FIG. 8.
Figure 10:
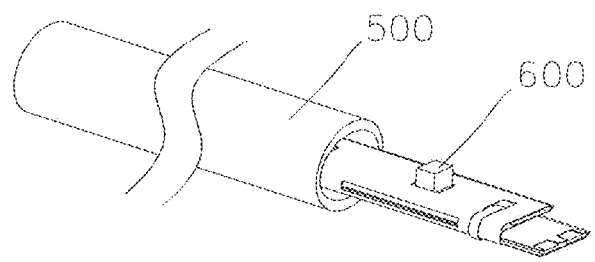
FIG. 10 is a schematic diagram showing the flexible circuit board of FIG. 8 which is fitted into an insulation cladding layer.
Figure 11:
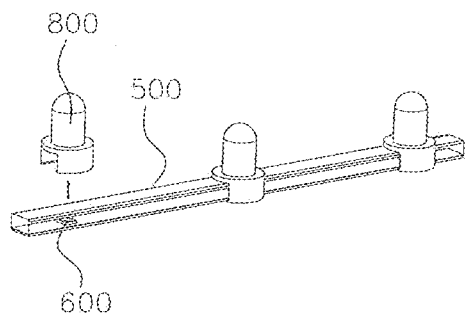
FIG. 11 is an assembly diagram of a light transmitting component in accordance with one embodiment of the present disclosure.
Figure 20:
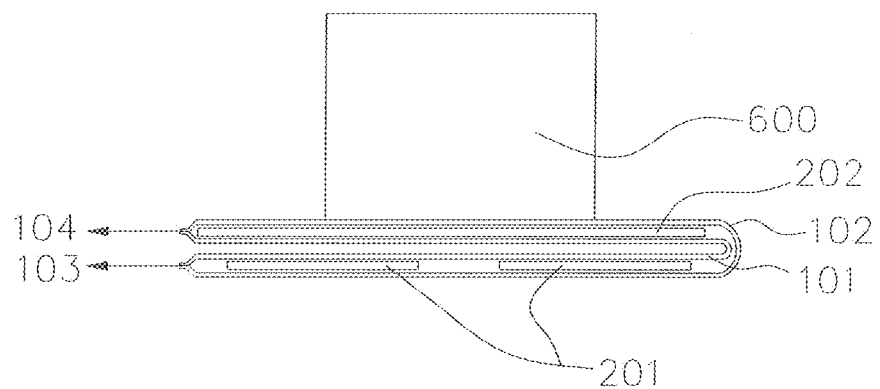
FIG. 20 is a side view of the flexible circuit board of FIG. 19.
Figure 21:
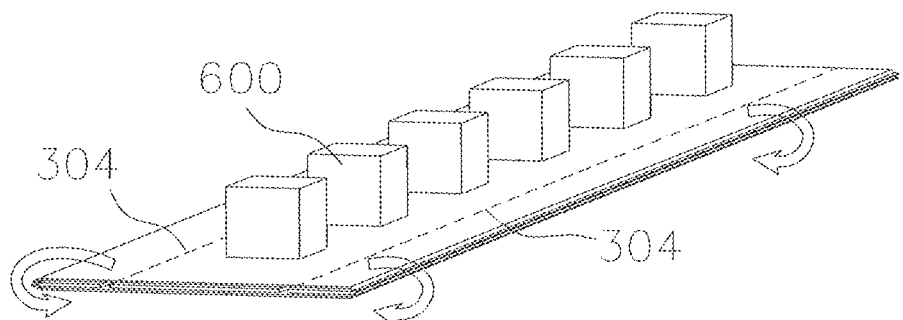
FIG. 21 is an assembly diagram of a flexible circuit board in accordance with one embodiment of the present disclosure.
Figure 22:
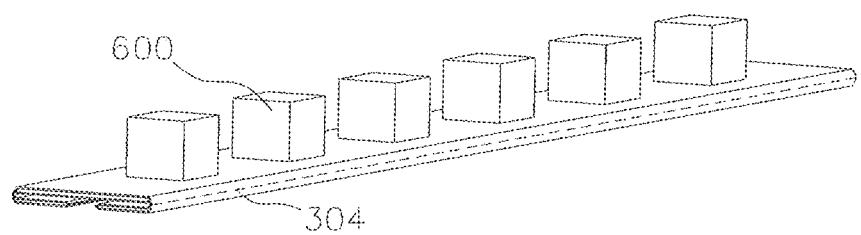
FIG. 22 is a schematic diagram showing the flexible circuit board of FIG. 21 which has been folded.
Figure 23:
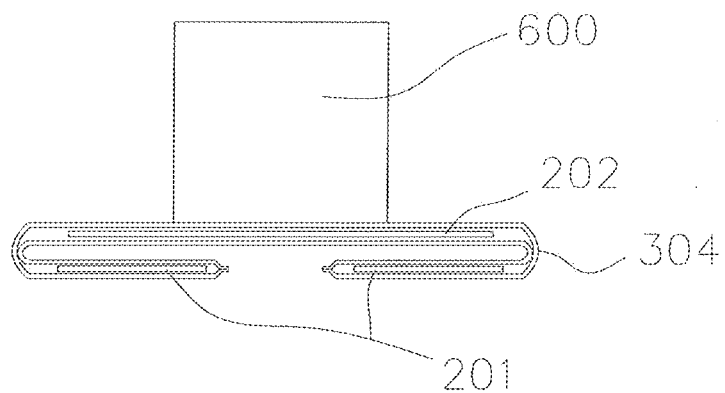
FIG. 23 is a side view of the flexible circuit board of FIG. 22.
Figure 24:
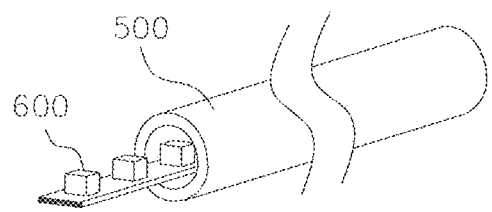
FIG. 24 is a schematic diagram showing the flexible circuit board of FIG. 22 which is fitted into an insulation cladding layer which is circular in cross section.
Figure 25:
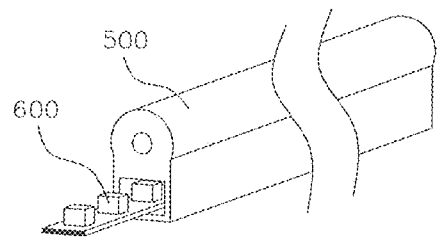
FIG. 25 is a schematic diagram illustrating a flexible circuit board which is fitted into an insulation cladding layer which is arched in cross section in accordance with one embodiment of the present disclosure.
Figure 26:
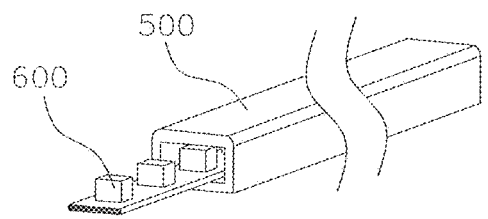
FIG. 26 is a schematic diagram illustrating a flexible circuit board which is fitted into an insulation cladding layer which is rectangular in cross section in accordance with one embodiment of the present disclosure.

The flexible circuit board is formed with a plurality of folded plane layers including a power wire folded plane layer 103 and a lighting wire folded plane layer 104, as shown in FIGS. 7 and 20. The power wire folded plane layer 103 includes a first insulation layer 101, a power wire 201 and a second insulation layer 102, while the lighting wire folded plane layer 104 includes a first insulation layer 101, a lighting wire 202 and a second insulation layer 102. The foldable portion is located between the power wire folded plane layer 103 and the lighting wire folded plane layer 104. The power wire folded plane layer 103 and the lighting wire folded plane layer 104 are folded with respect to the foldable portion. The power wire 201 and the lighting wire 202 are provided on their corresponding power wire folded plane layer 103 and lighting wire folded plane layer 104 respectively, so when the flexible circuit board is folded, only the insulation layers are folded, while the power wire 201 and the lighting wire 202 are not bent, and the width of the insulation layer will be much smaller after being folded, reducing the width of the flexible circuit board.

The flexible circuit board includes at least one lighting wire folded plane layer 104 which includes at least one lighting wire. A foldable portion is provided between the adjacent lighting wire folded plane layers 104, and the adjacent lighting wire folded plane layers 104 are folded with respect to the foldable portion. When there is one lighting wire folded plane layer 104, the width of the flexible circuit board is small, bringing more convenient to use, and when there are two lighting wire folded plane layers 104, both sides of the flexible circuit board are equipped with a LED light source, bringing a larger light-emitting angle.

Figure 18:
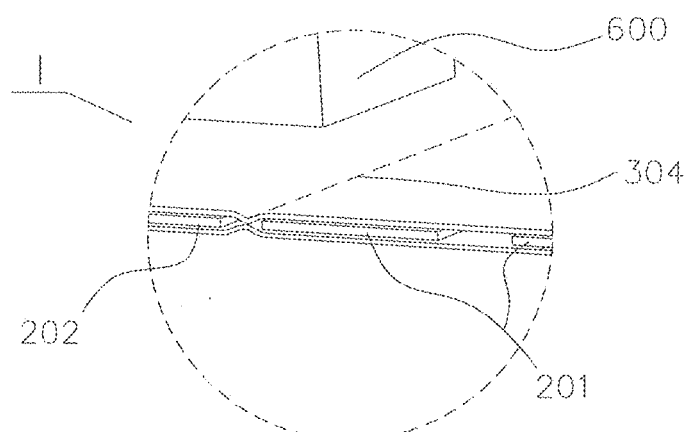
FIG. 18 is partial enlarged diagram of Area I in FIG. 17.
Figure 19:
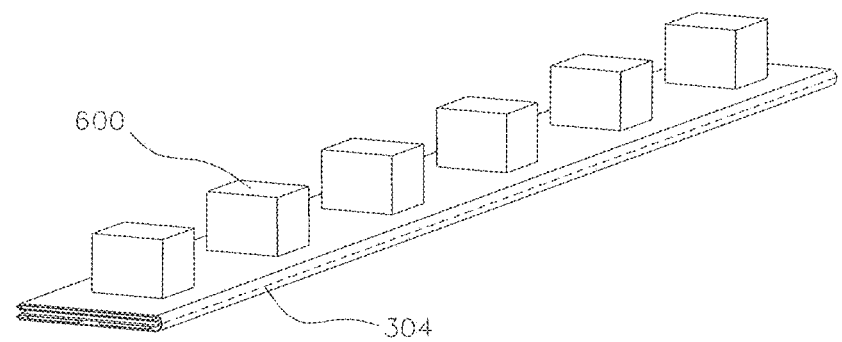
FIG. 19 is a schematic diagram showing the flexible circuit board of FIG. 17 which has been folded.

In one embodiment, as shown in FIGS. 1-10, the foldable portion may be a die cut 301. The die cut 301 not only saves material but also reduces the drag force between the plane layers to increase the bending ability of the circuit board, and reduces wrinkling. In other embodiments, as shown in FIGS. 17-23, the foldable portion may be a folding line 304. The first insulation layer and the second insulation layer can be folded by the folding line 304 which brings a good folding effect and reduces wrinkling. As shown in FIG. 18, The folding line 304 is formed by the compression of the cutting die, and the first insulation layer 101 and/or the second insulation layer 102 are pressed on the position of the folding line to form a groove having a thickness below other positions of the insulation layers. The folding line 304 may be formed by other ways, for example, the hardness of the position to form a folding line 304 is lower than that of adjacent positions.

In one embodiment, as shown in FIGS. 2-6, the number of the power wires 201 may be two. The two power wires 201 are arranged on the same power wire folded plane layer 103 parallelly, and two lighting wires 202 are arranged on one side of the power wires 201 parallelly. The first insulation layer 101 and the second insulation layer 102 are provided with a first die cut 301 between the power wires 201 and the lighting wires 202, and the first insulation layer 101 and the second insulation layer 102 are provided with a second die cut 302 between the two lighting wires 202. The first die cut 301 of the first insulation layer 101 is corresponding in position with the first die cut 301 of the second insulation layer 102, and the second die cut 302 of the first insulation layer 101 is corresponding in position with the second die cut 302 of the second insulation layer 102. Each of the first insulation layer 101 and the second first insulation layer 102 is folded along their own first die cut 301 and second die cut 302 to form three folded plane layers. In this structure, the power wires 201 is placed in the middle folded plane layer of the three folded plane layers, and two lighting wires are placed in the top folded plane layer and the bottom folded plane layer of the three folded plane layers respectively, such that both of the top side and the bottom side of the flexible circuit board can give out light, result in a better lighting effect. The folding path of the flexible circuit board is an oblate roll after the flexible circuit board is folded, and when the flexible circuit board is unfolded, the SMD LEDs may be welded on the same side of the flexible circuit board, such that the LEDs can be welded by single side SMT and both of sides of the flexible circuit board can give out light after the flexible circuit board is folded. In a traditional flexible circuit board structure, a double-sided circuit board should be produced at first, and the SMD LEDs will be welded by SMT on the front and the back of the circuit board, but, when welding LEDs on the back, the previously welded LEDs on the front is at the bottom of the circuit board and may fall due to solder on the front melted down by the heat.

In one embodiment, as shown in FIGS. 7-10, the number of the power wires 201 may be two. The two power wires are arranged on the same power wire folded plane layer 103 parallelly, one lighting wire 202 is arranged on one side of the power wires 201. The first insulation layer 101 and the second insulation layer 102 are provided with a first die cut 301 between the power wires 201 and the lighting wire 202, the first die cut 301 of the first insulation layer 101 is corresponding in position with the first die cut 301 of the second insulation layer 102, each of the first insulation layer 101 and the second first insulation layer 102 is folded along their own first die cut 301 to form two folded plane layers, and the lighting wire folded plane layer 104 where the lighting wire 202 is placed in is located above the power wire folded plane layer 103 where the power wire is placed in.

As shown in FIG. 7, the first die cut 301 and the second die cut 302 include a plurality of die cuts alternatively arranged on a same row. In this structure, the circuit board is easy to be folded, and the folded plane layers are easy to be close to each other. Meanwhile, because the thickness of the folded multi-layer structure is thicker than that of a unfolded single layer structure, the flexible circuit board of the present disclosure has a stronger tensile strength, which comply with tension test requirements of safety standards better.

In one embodiment, as shown in FIGS. 15, 21, 22, 23 and 27, the power wire 201 includes a first power wire 211 and a second first power wire 221 both of which are located on both sides of the circuit board respectively, the lighting wire 202 is located between the first power wire 211 and the second power wire 221, and the number of the lighting wire 202 is one or two. As show in FIGS. 21-23, the number of the lighting wire 202 is one. As show in FIGS. 15 and 17, the number of the lighting wire 202 is two. The two lighting wires 202 are arranged parallelly, each of the first insulation layer 101 and the second insulation layer 102 is provided with a folding line 304 or a third die cut 303 between the lighting wires 202, each of the first insulation layer 101 and the second first insulation layer 102 is folded along their own third die cut 303 to form two folded plane layers, and each of the folded plane layers includes a power wire 201 and a lighting wire 202. In this way, both of sides of the flexible circuit board can give out light even there are only two folded plane layers, and the flexible circuit board has a smaller width.

Figure 27:
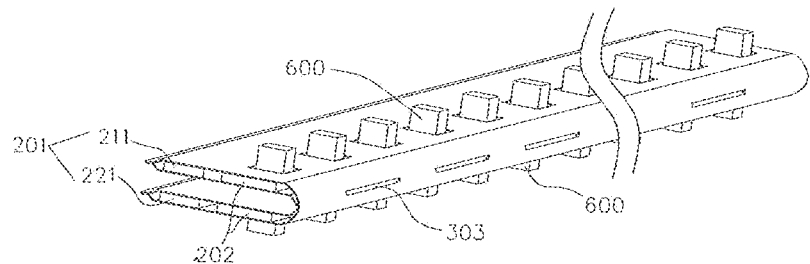
FIG. 27 is a schematic diagram illustrating a flexible circuit board which has been folded in accordance with one embodiment of the present disclosure.

As shown in FIG. 27, the third die cut 303 includes a plurality of die cuts alternatively arranged on a same row. In this structure, the circuit board is easy to be folded, and the folded plane layers are easy to be close to each other. Meanwhile, because the thickness of the folded multilayer structure is thicker than that of a unfolded single layer structure, the flexible circuit board of the present disclosure has a stronger tensile strength, which comply with tension test requirements of safety standards better.

Figure 1:
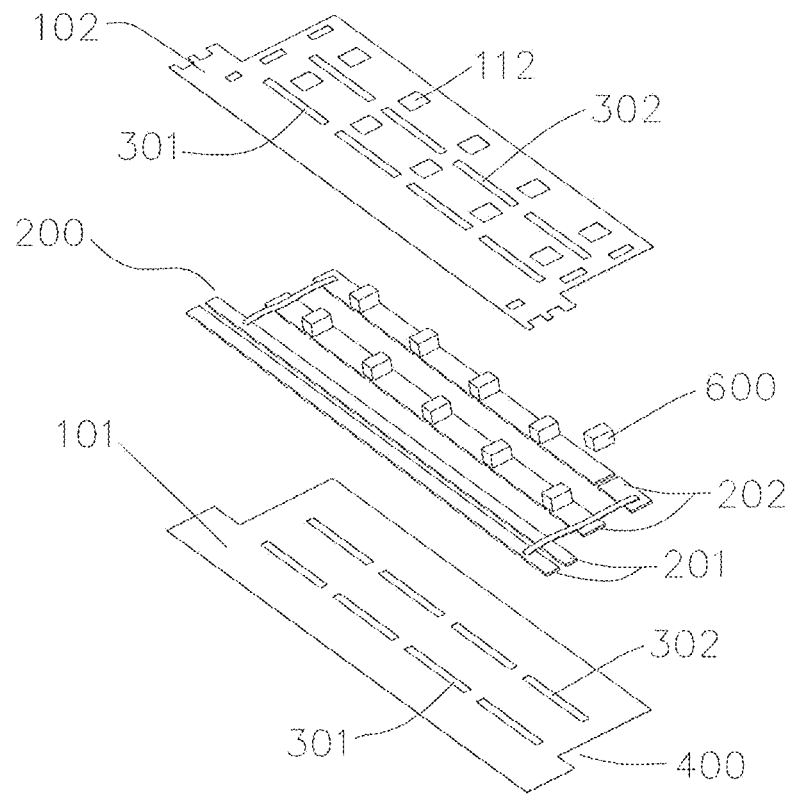
FIG. 1 is an exploded diagram illustrating a flexible circuit board in accordance with certain embodiments of the present disclosure.
Figure 2:
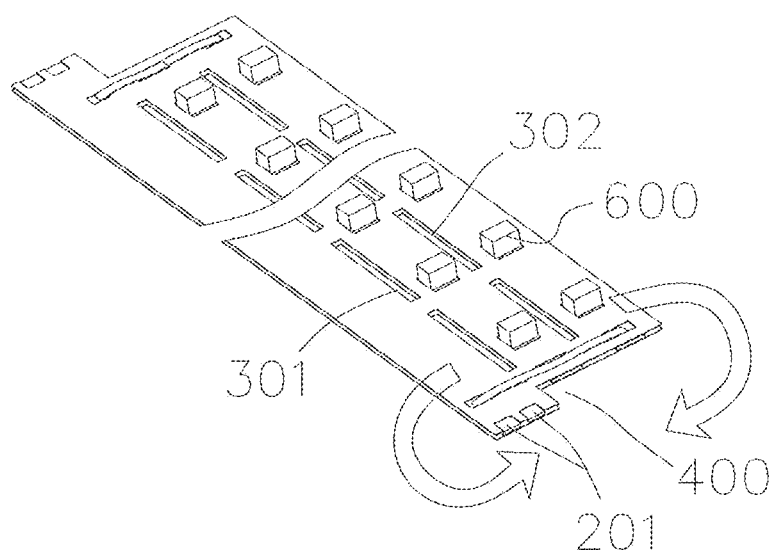
FIG. 2 is an assembly diagram of a flexible circuit board in accordance with one embodiment of the present disclosure.
Figure 3:
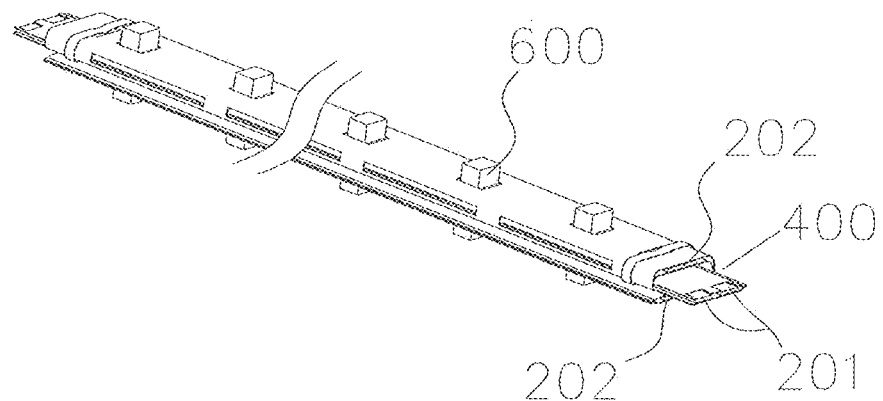
FIG. 3 is a schematic diagram showing the flexible circuit board of FIG. 1 which has been folded.
Figure 4:
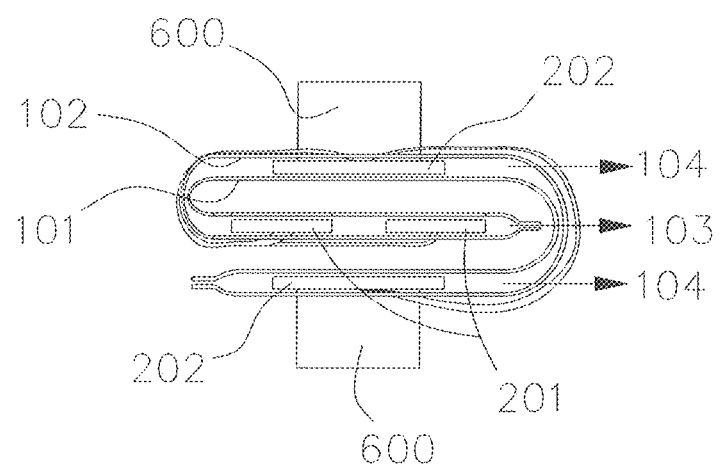
FIG. 4 is a side view of the flexible circuit board of FIG. 3.
Figure 5:
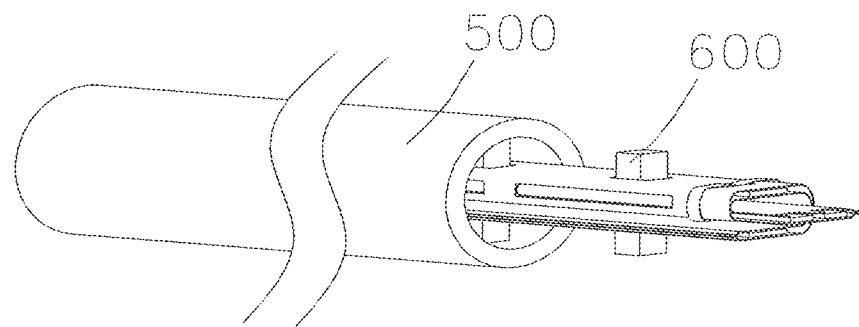
FIG. 5 is a schematic diagram showing the flexible circuit board of FIG. 3 which is fitted into an insulation cladding layer.

As shown in FIGS. 1 and 6, areas in the first insulation layer 202 and the second insulation layer 202 corresponding to the lighting wire 202 are equal in length to the lighting wire 202, areas in the first insulation layer 101 and the second insulation layer 102 corresponding to the power wire 201 are equal in length to the power wire 201, the power wire 201 is longer than the lighting wire 202, and gaps 400 are formed between the area in the first insulation layer 101 corresponding to the lighting wire 202 and the area in the first insulation layer 101 corresponding to the power wire 201, and between the area in the second insulation layer 102 corresponding to the lighting wire 202 and the area in the second insulation layer 102 corresponding to the power wire 201. In this structure, the creepage distance between an end of the lighting wire 202 and an end of the power wire 201 can be increased, which helps to realize and meet the requirement of the creepage distance required by safety standards.

The thickness of the lighting wire 202 is lower than that of the power wire 201. In this way, such configuration will save the material as well as increase the flexibility of the lighting wire 202 to avoid LED welding spot cracking in a situation that the circuit board is excessively bent, and it will result in more reliable quality.

An adhesive is provided between the folded plane layers, by which the folded plane layers are adhered together to prevent the folded plane layers from warping.

In accordance with certain embodiments, described with reference to FIGS. 1-26, a LED flexible strip light includes an insulation cladding layer 500, a plurality of LED light sources 600 and a flexible circuit board as above. A plurality of fractures 700 are provided on a same lighting wire 202, the LED light source 600 is welded on the fracture 700 or across two adjacent lighting wires 202, positions in the first insulation layer 101 and/or second insulation layer 102 corresponding to the fractures 700 are provided with LED windows 112, and the LED light source 600 is welded on the fracture 700 and positioned in the LED window 112. The flexible circuit board is cladded by an insulation cladding layer 500. The LED light source 600 may be a SMD (Surface Mount Device) LED or a bonding LED chip, and the LED light source may have at least one LED chip. The insulation cladding layer may include an inner insulation cladding layer and an outer insulation cladding layer, the inner insulation cladding layer is made of a translucent material or an opaque material which is selected from the group consisting of PU glue, TPU glue, silicone and PVC glue, and the outer insulation cladding layer is made of a translucent material. As shown in FIGS. 24-26 and 28-30, the insulation cladding layer may be rectangular, circular or arched in cross section. The insulation cladding layer 500 fitting the shape of a LED tape light, a duralight or a flexible neon lamp can be used as required.

The LED flexible strip light in this folding structure is simple in manufacture, reduce its width, and reduce the material of the insulation cladding layer by over 35% to significantly reduce costs. And the LED flexible strip light is thinner that it is convenient to be packed, transported and installed, which conforms to the development tendency of the LED flexible strip light.

Figure 28:
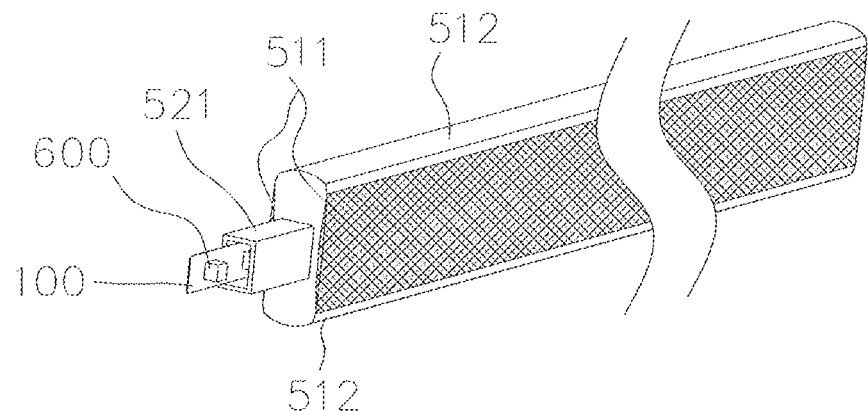
FIG. 28 is a schematic diagram illustrating a flexible circuit board which is fitted into a flat insulation cladding layer in accordance with one embodiment of the present disclosure.
Figure 29:
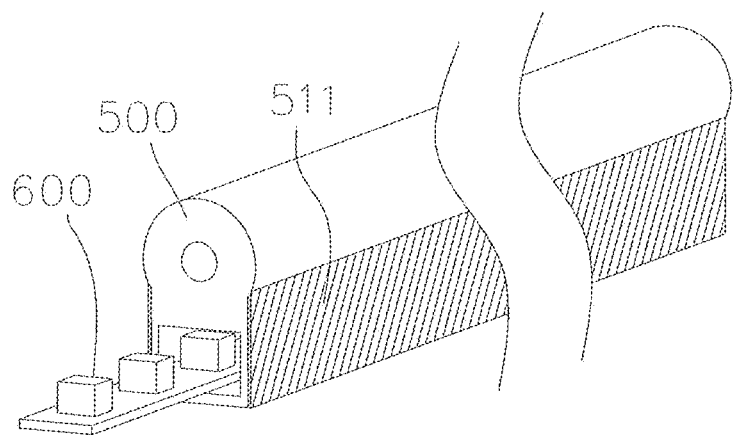
FIG. 29 is a schematic diagram illustrating a flexible circuit board which is fitted into an insulation cladding layer which is arched in cross section can with a light blocking layer in accordance with one embodiment of the present disclosure.
Figure 30:
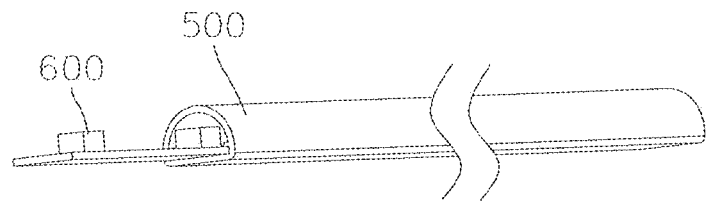
FIG. 30 is a schematic diagram illustrating a flexible circuit board which is fitted into an insulation cladding layer which is D-shaped in cross section in accordance with one embodiment of the present disclosure.

As shown in FIG. 28, the insulation cladding layer 500 is a flat shape in cross section, two sides of the insulation cladding layer 500 are reflective bodies 511 completely or partially, the top of the insulation cladding layer 500 is an insulated light transmitting body 512, the bottom of the insulation cladding layer 500 is an insulated light transmitting body 512 or reflective body 511 or a combination of the light transmitting body 512 and the reflective body 511, the LED light source 600 is welded on the flexible circuit board 100, and the flexible circuit board 100 is vertically positioned that the side of the flexible circuit board 100 on which the LED light source 500 is welded faces towards the lateral side of the insulation cladding layer 500.

As shown in FIGS. 11 and 31-35, a plurality of light transmitting components 800 protruding from the outside surface of the insulation cladding layer 500 are provided on each position corresponding to each of the LED light sources 600 on the outside surface of the insulation cladding layer 500, and each light transmitting component 800 is independent and arranged separating from any other. The light transmitting components 800 is used for transmitting light to make the LED light sources 600 have a better light quality. The space between the light transmitting components may be larger than 4.5 centimeters. When the space between the light transmitting components is larger than 4.5 centimeters, the effect of the point light source should be more obvious.

The light transmitting component 800 may be positioned on the insulation cladding layer by threaded connecting, bonding, riveting, binding or fastening. The light transmitting component 800 can be positioned on the insulation cladding layer in any way as required.

Figure 12:
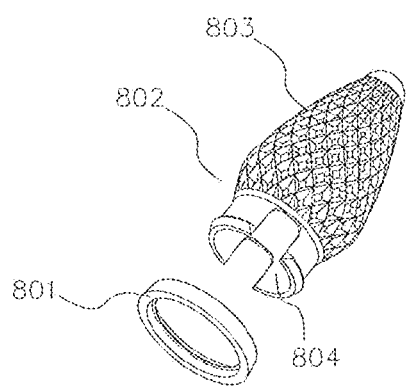
FIG. 12 is a schematic diagram of a light transmitting component in accordance with one embodiment of the present disclosure.
Figure 13:
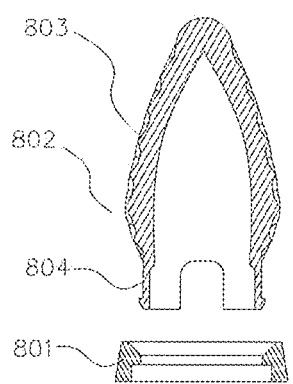
FIG. 13 is a section view of a cover of the light transmitting component of FIG. 12.
Figure 14:
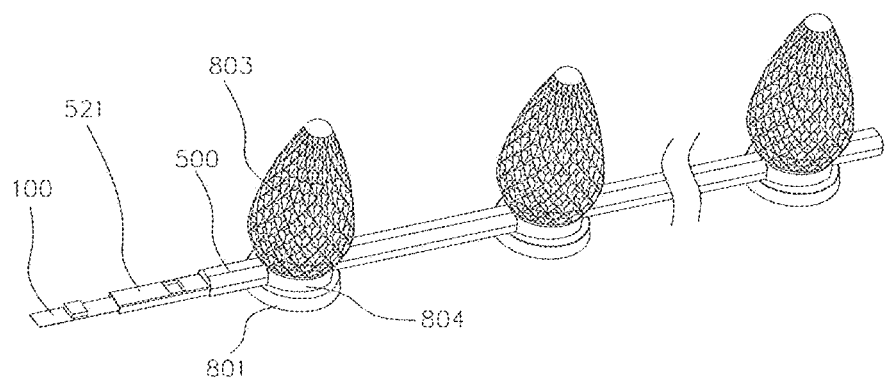
FIG. 14 is a schematic diagram illustrating an installation of the light transmitting component of FIG. 12.
Figure 15:
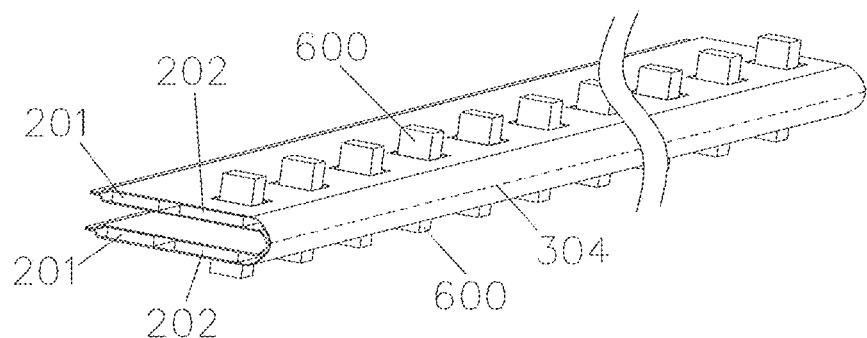
FIG. 15 is a schematic diagram illustrating a folded flexible circuit board in accordance with one embodiment of the present disclosure.

As shown in FIGS. 12-14, the light transmitting component 800 includes a connector 801 and a cover 802. The cover 802 includes a light transmitting portion 803 placed towards a LED light-emitting surface, and a clamping portion 804 for clamping the insulation cladding layer 500, and the light transmitting portion 803 and the clamping portion 804 are made of a whole. The connector 801 is fixed with the cover 802, and fastens the insulation cladding layer 500 in the clamping portion 804. The connector 801 may be circular, and the outside surface of the clamping portion 804 may be a circular surface making it convenient to fasten the connector 801 on the cover 802, without directional limitation, and making it possible to achieved mechanization and automation in fastening.

Figure 38:
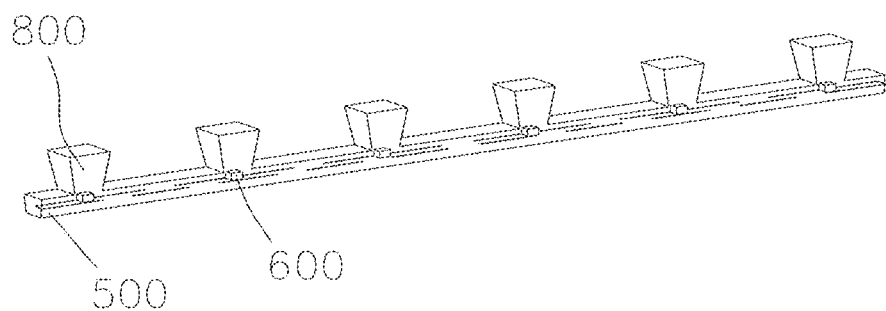
FIG. 38 is a schematic diagram illustrating a light transmitting component integrally formed with an insulation cladding layer in a LED flexible strip light in accordance with certain embodiments of the present disclosure.

In one embodiment, as shown in FIG. 38, the light transmitting component 800 and the insulation cladding layer 500 are molded in one body, which brings a higher efficiency of light transmitting, and makes the light transmitting component 800 not detach from the insulation cladding layer 500. In other embodiments, the light transmitting component 800 can be positioned on the insulation cladding layer 500 by threaded connecting, bonding, riveting, binding or fastening as required, as shown in FIGS. 11-14, which is more convenient and flexible.

Figure 31:
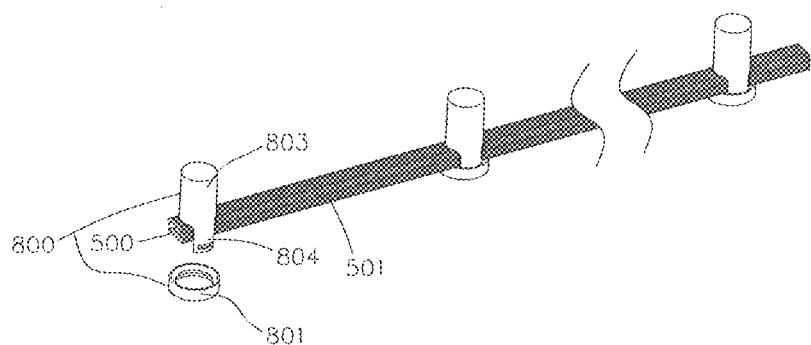
FIG. 31 is a schematic diagram illustrating a cylindrical light transmitting component arranged on an insulation cladding layer with a light blocking layer in accordance with one embodiment of the present disclosure.
Figure 32:
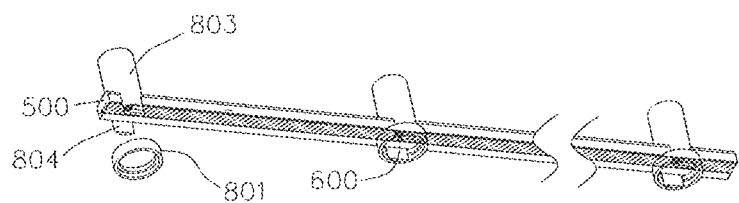
FIG. 32 is a schematic diagram illustrating a cylindrical light transmitting component arranged on an insulation cladding layer without a light blocking layer in accordance with one embodiment of the present disclosure.
Figure 33:
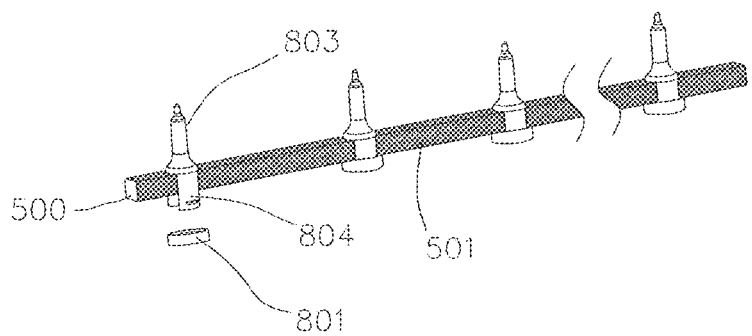
FIG. 33 is a schematic diagram illustrating a light transmitting component with a shape of lala bulb arranged on an insulation cladding layer with a light blocking layer in accordance with one embodiment of the present disclosure.
Figure 34:
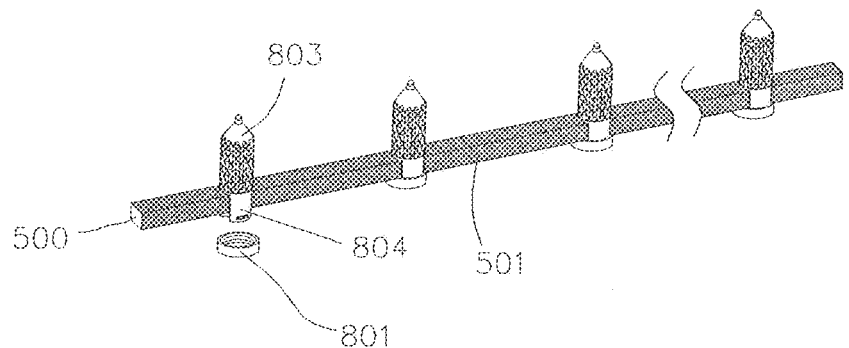
FIG. 34 is a schematic diagram illustrating a light transmitting component with a shape of pine cone arranged on an insulation cladding layer with a light blocking layer in accordance with one embodiment of the present disclosure.
Figure 35:
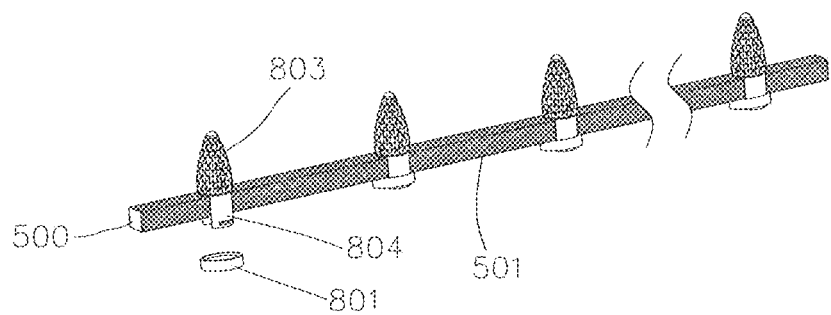
FIG. 35 is a schematic diagram illustrating a light transmitting component with a shape of strawberry arranged on an insulation cladding layer with a light blocking layer in accordance with one embodiment of the present disclosure.
Figure 39:
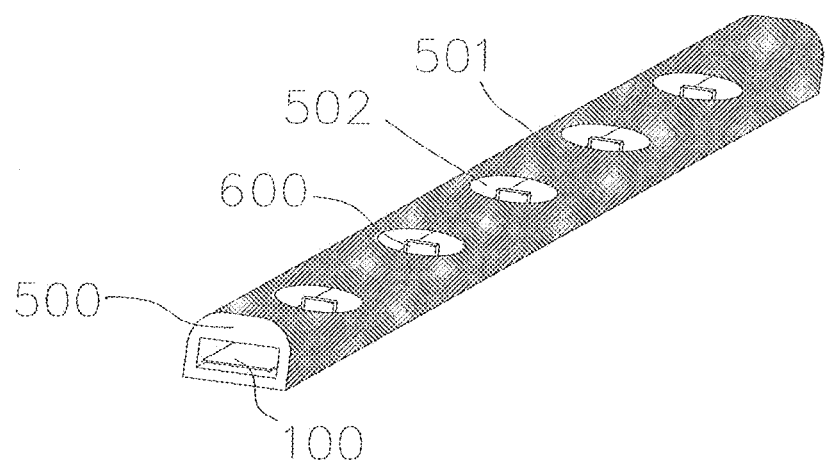
FIG. 39 is a schematic diagram showing light outlet windows and a light blocking layer in a LED flexible strip light in accordance with certain embodiments of the present disclosure.

As shown in FIG. 39, a light blocking layer 501 is provided around the outside surface of the insulation cladding layer 500. A plurality of separate light outlet windows 502 are provided on each position corresponding to the light-emitting surface of each of the LED light sources 600 on the light blocking layer 501. The light blocking layer 501 may be ink or paint to achieve a better illumination of a point light source, while the light emitted from a traditional LED flexible strip light without a light blocking layer 501 is appeared as a linear light source. As shown in FIGS. 31 and 39, the position corresponding to the light outlet window 502 may be provided with a light transmitting component 800.

Figure 16:
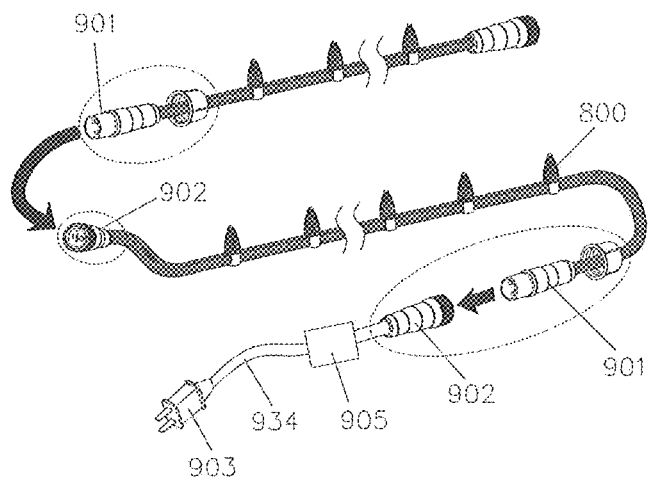
FIG. 16 is a schematic diagram illustrating a LED flexible strip light in accordance with certain embodiments of the present disclosure.
Figure 17:
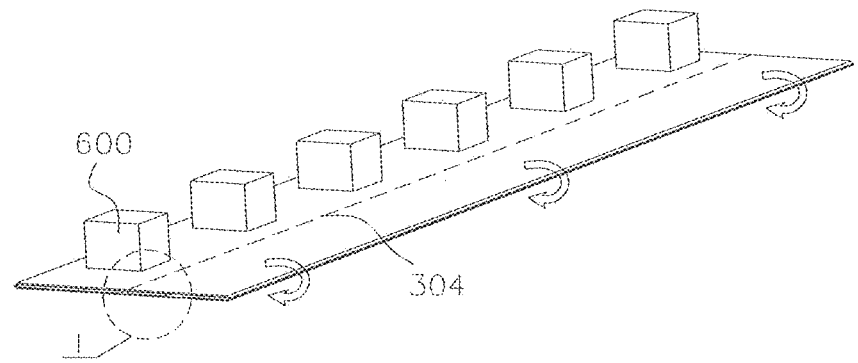
FIG. 17 is an assembly diagram of a flexible circuit board in accordance with one embodiment of the present disclosure.

As shown in FIG. 16, the power port can include a power plug 903, a current or voltage conversion device 905 and a wire 934, and the current or voltage conversion device 905 may be a rectifier bridge, constant current power supply or switching power supply.

Figure 36:
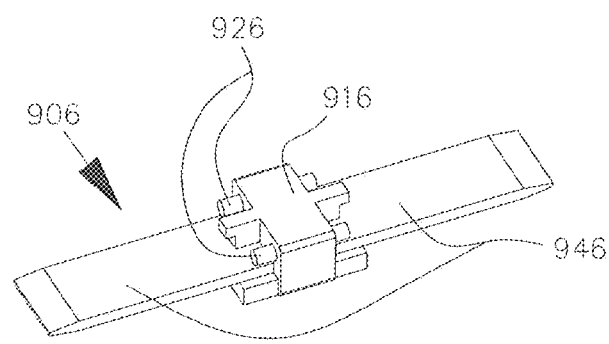
FIG. 36 is a schematic diagram illustrating a connection head in a LED flexible strip light in accordance with one embodiment of the present disclosure.
Figure 37:
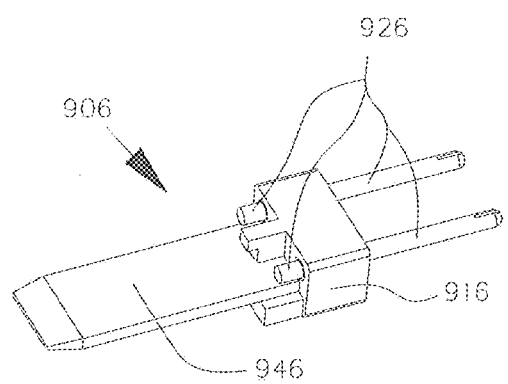
FIG. 37 is a schematic diagram illustrating a connection head in a LED flexible strip light in accordance with another embodiment of the present disclosure.

As shown in FIGS. 36 and 37, the LED flexible strip light further includes a connection head 906 used to connect two LED flexible strip lights or connect the LED flexible strip light with a power cord. The connection head 906 includes a fixed part 916, and two hard metal conductor strips 926 which are spaced apart from each other and are arranged in parallel. Each of the hard metal conductor strips 926 includes two ends as two connection ends of the connection head 906. The hard metal conductor strip 926 is electrically connected with power wire of the flexible circuit board or the power cord. A part of the hard metal conductor strip 926 is enveloped in the fixed part 916. The fixed part 916 expands towards two ends or one of the ends of the hard metal conductor strip to form a tongue plate 946 which can be inserted into and fastened to the gap between the insulation cladding layer and the flexible circuit board.

Figure 40:
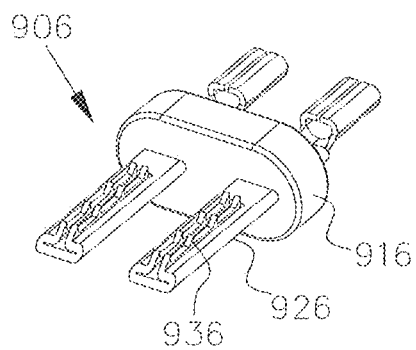
FIG. 40 is a schematic diagram illustrating a connection head in a LED flexible strip light in accordance with a further embodiment of the present disclosure.
Figure 41:
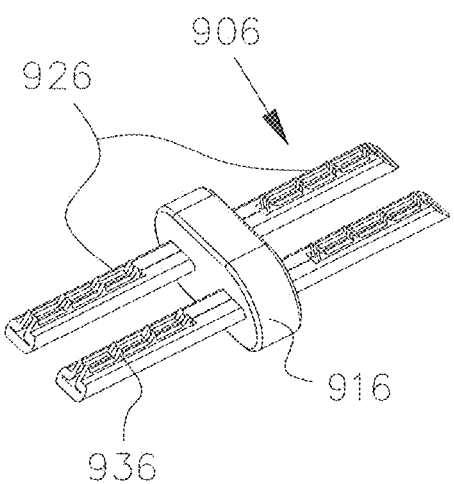
FIG. 41 is a schematic diagram illustrating a connection head in a LED flexible strip light in accordance with still a further embodiment of the present disclosure.

As shown in FIGS. 40 and 41, the surface of the hard metal conductor strip 926 is provided with at least one puncture portion 936 used to puncture the first insulation layer 101 and/or the second insulation layer 102 of the flexible circuit board and electrically contact with the power wire 201 of the flexible circuit board. A part of the hard metal conductor strip 926 is enveloped in the fixed part 916.

As shown in FIG. 16, two ends of the LED flexible strip light are provided with a male connector 901 and a female connector 902 respectively. The male connector 901 and the female connector 902 can be engaged with each other and also can be disengaged from each other, which is easier for operation.

In accordance with certain embodiments, described with reference to FIGS. 1-4 and 6, a method for manufacturing the flexible circuit board as above includes: arranging three flat wires formed by metal wire calendaring parallelly, where the flat wires includes two power wires 201 adjacently placed, and at least one lighting wire 202 provided with a fracture 700 needed; attaching a first insulation layer 101 and a second insulation layer 102 to the upper and lower surfaces of the power wire 201 and the lighting wire 202 respectively; and folding the first insulation layer 101 and the second insulation layer 102 to form a power wire folded plane layer 103 and a lighting wire folded plane layer 104, where the power wire folded plane layer 103 only includes a power wire 201. The first insulation layer 101 and the second insulation layer 102 are provided with a plurality of die cuts 301, 302 along a folded position. The flexible circuit board manufactured in the above method has the advantages of a narrow width, easy manufacture and good heat dissipation effect.

Although the invention herein has been described with reference to various embodiments, it is to be understood that the embodiments are merely illustrative of the principles and applications of the present invention. It is therefore to be understood that a number of variations and modifications may be made to the illustrative embodiments without departing from the inventive spirit and scope of the present disclosure. Accordingly, the scope of the present disclosure is defined by the appended claims rather than the foregoing description and the exemplary embodiments described therein.

What is claimed is:

1. A flexible circuit board, comprising a first insulation layer, a second insulation layer, and a circuit layer, wherein the first insulation layer is attached to one side of the circuit layer and the second insulation layer is attached to the other side of the circuit layer, each of the first insulation layer and the second insulation layer is provided with a foldable portion along the length thereof, the foldable portion of the first insulation layer is corresponding in position with the foldable portion of the second insulation layer, and the circuit layer comprises a set of power wires and at least one lighting wire wherein the flexible circuit board is folded to form a plurality of folded plane layers comprising a power wire folded plane layer and a lighting wire folded plane layer, the power wire folded plane layer comprises a first insulation layer, a power wire and a second insulation layer, the lighting wire folded plane layer comprises a first insulation layer, a lighting wire and a second insulation layer, the foldable portion is located between the power wire folded plane layer and the lighting wire folded plane layer, and the power wire folded plane layer and the lighting wire folded plane layer are folded with respect to the foldable portion, wherein the lighting wire folded plane layer and the power wire folded plane layer are not coplanar.

2. The flexible circuit board of claim 1, wherein the power wire and the lighting wire are formed by etching technology or metal wire calendering.

3. The flexible circuit board of claim 1, wherein at least one lighting wire is contained in a same lighting wire folded plane layer, the number of the lighting wire folded plane layers is at least one, a foldable portion is provided between adjacent lighting wire folded plane layers, and the adjacent lighting wire folded plane layers are folded with respect to the foldable portion.

4. The flexible circuit board of claim 1, wherein the foldable portion is a folding line.

5. The flexible circuit board of claim 1, wherein the foldable portion is a die cut.

6. The flexible circuit board of claim 1, wherein the number of the power wires is two, the two power wires are arranged on a same power wire folded plane layer parallelly, two lighting wires are arranged on one side of the power wires parallelly, the first insulation layer and the second insulation layer are provided with a first die cut between the power wires and the lighting wires, the first insulation layer and the second insulation layer are provided with a second die cut between the two lighting wires, the first die cut of the first insulation layer is corresponding in position with the first die cut of the second insulation layer, the second die cut of the first insulation layer is corresponding in position with the second die cut of the second insulation layer, each of the first insulation layer and the second first insulation layer is folded along their own first die cut and second die cut to form three folded plane layers, the power wire folded plane layer where the power wire is placed in is in the middle of the three folded plane layers, the lighting wire folded plane layers where the two lighting wires are placed in respectively are located in the top and the bottom of the three folded plane layers respectively, and the three folded plane layers form a flat-shaped coil.

7. The flexible circuit board of claim 1, wherein the number of the power wires is two, the two power wires are arranged on the same power wire folded plane layer parallelly, one lighting wire is arranged on one side of the power wires, the first insulation layer and the second insulation layer are provided with a first die cut between the power wires and the lighting wire, the first die cut of the first insulation layer is corresponding in position with the first die cut of the second insulation layer, each of the first insulation layer and the second first insulation layer is folded along their own first die cut to form two folded plane layers, and the lighting wire folded plane layer where the lighting wire is placed in is located above the power wire folded plane layer where the power wire is placed in.

8. The flexible circuit board of claim 1, wherein the power wires comprise a first power wire and a second first power wire, each of which is located on each side of the circuit board respectively, the lighting wire is located between the first power wire and the second power wire, and the number of the lighting wire is one or two.

9. The flexible circuit board of claim 8, wherein the number of the lighting wires is two, the two lighting wires are arranged parallelly, each of the first insulation layer and the second insulation layer is provided with a third die cut between the lighting wires, each of the first insulation layer and the second first insulation layer is folded along their own third die cut to form two folded plane layers, and each of the folded plane layers comprises a power wire and a lighting wire.

10. The flexible circuit board of claim 1, wherein areas in the first insulation layer and the second insulation layer corresponding to the lighting wire are equal in length to the lighting wire, areas in the first insulation layer and the second insulation layer corresponding to the power wire are equal in length to the power wire, the power wire is longer than the lighting wire, and gaps are formed between the area in the first insulation layer corresponding to the lighting wire and the area in the first insulation layer corresponding to the power wire, and between the area in the second insulation layer corresponding to the lighting wire and the area in the second insulation layer corresponding to the power wire.

11. The flexible circuit board of claim 1, wherein the thickness of the lighting wire is lower than that of the power wire.

12. A LED flexible strip light, comprising an insulation cladding layer, a plurality of LED light sources and a flexible circuit board of claim 1, wherein a plurality of fractures are provided on a same lighting wire, the LED light source is welded on the fracture or across two adjacent lighting wires, positions in the first insulation layer and/or second insulation layer corresponding to the LED light sources are provided with LED windows, and the flexible circuit board is cladded by an insulation cladding layer.

13. The LED flexible strip light of claim 12, wherein the insulation cladding layer is a flat shape in cross section, two sides of the insulation cladding layer are reflective bodies completely or partially, the top of the insulation cladding layer is an insulated light transmitting body, the bottom of the insulation cladding layer is an insulated light transmitting body or reflective body, the LED light source is welded on the flexible circuit board, and the flexible circuit board is vertically positioned that the side of the flexible circuit board on which the LED light source is welded faces towards the lateral side of the insulation cladding layer.

14. The LED flexible strip light of claim 12, wherein a plurality of light transmitting components protruding from the outside surface of the insulation cladding layer are provided on each position corresponding to each of the LED light sources on the outside surface of the insulation cladding layer, and each light transmitting component is independent and arranged separating from any other.

15. The LED flexible strip light of claim 14, wherein the light transmitting component is positioned on the insulation cladding layer by threaded connecting, bonding, riveting, binding or fastening.

16. The LED flexible strip light of claim 15, wherein the light transmitting component comprises a connector and a cover, the cover comprises a light transmitting portion placed towards a LED light-emitting surface, and a clamping portion for clamping the insulation cladding layer, the light transmitting portion and the clamping portion are made of a whole, and the connector is fixed with the cover and fastens the insulation cladding layer in the clamping portion.

17. The LED flexible strip light of claim 14, wherein the light transmitting component and the insulation cladding layer are made of a whole, that is, the light transmitting component is integral with the insulation cladding layer.

18. The LED flexible strip light of claim 12, wherein a light blocking layer is provided around the outside surface of the insulation cladding layer, and a plurality of separate light outlet windows are provided on each position corresponding to the light-emitting surface of each of the LED light sources on the light blocking layer.

19. The LED flexible strip light of claim 12, further comprising a connection head used to connect two LED flexible strip lights or connect the LED flexible strip light with a power cord, wherein the connection head comprises a fixed part, and two hard metal conductor strips which are spaced apart from each other and are arranged in parallel, each of the hard metal conductor strips comprises two ends as two connection ends of the connection head, the surface of the hard metal conductor strip is provided with at least one puncture portion used to puncture the first insulation layer and/or the second insulation layer of the flexible circuit board and electrically contact with the power wire of the flexible circuit board, and a part of the hard metal conductor strip is enveloped in the fixed part.

20. The LED flexible strip light of claim 12, further comprising a connection head used to connect two LED flexible strip lights or connect the LED flexible strip light with a power cord, wherein the connection head comprises a fixed part, and two hard metal conductor strips which are spaced apart from each other and are arranged in parallel, each of the hard metal conductor strips comprises two ends as two connection ends of the connection head, the hard metal conductor strip is electrically connected with power wire of the flexible circuit board or the power cord, a part of the hard metal conductor strip is enveloped in the fixed part, and the fixed part expands towards two ends or one of the ends of the hard metal conductor strip to form a tongue plate which is inserted into and fastened to the gap between the insulation cladding layer and the flexible circuit board.

21. The LED flexible strip light of claim 12, wherein the insulation cladding layer comprises an inner insulation cladding layer and an outer insulation cladding layer, the inner insulation cladding layer is made of a translucent material or an opaque material which is selected from the group consisting of PU glue, TPU glue, silicone and PVC glue, and the outer insulation cladding layer is made of a translucent material.

22. A method for manufacturing the flexible circuit board of claim 1, comprising:
arranging a plurality of flat wires formed by metal wire calendaring parallelly, wherein the flat wires comprises two power wires adjacently placed and at least one lighting wire provided with a fracture according to needing;
attaching a first insulation layer and a second insulation layer to the upper and lower surfaces of the power wire and the lighting wire respectively; and
folding the first insulation layer and the second insulation layer to form a power wire folded plane layer and a lighting wire folded plane layer, wherein the power wire folded plane layer only comprises a power wire.

* * * * *